United States Patent [19]
Wei

[11] Patent Number: 5,088,113
[45] Date of Patent: Feb. 11, 1992

[54] DIVERSITY CODED MODULATION

[75] Inventor: Lee-Fang Wei, Lincroft, N.J.

[73] Assignee: AT&T Bell Laboratories, Murray Hill, N.J.

[21] Appl. No.: 459,883

[22] Filed: Jan. 2, 1990

[51] Int. Cl.$^5$ .......................... H04L 1/02; H04B 7/02
[52] U.S. Cl. ...................................... 375/53; 375/57; 375/40; 371/37.1
[58] Field of Search .................... 375/40.1, 57, 53, 86; 371/37.1, 37.7, 43; 370/20, 2; 455/60

[56] References Cited

U.S. PATENT DOCUMENTS

| | | | |
|---|---|---|---|
| 4,616,364 | 10/1986 | Lee | 375/1 |
| 4,628,517 | 12/1986 | Schwarz et al. | 375/40 |
| 4,663,768 | 5/1987 | Ryu | 375/40 |
| 4,710,944 | 12/1987 | Nossen | 375/40 |
| 4,756,009 | 7/1988 | Braun et al. | 375/86 |
| 5,007,067 | 4/1991 | Ayanoglu et al. | 375/40 |

Primary Examiner—Douglas W. Olms
Assistant Examiner—Ralph Smith
Attorney, Agent, or Firm—Ronald D. Slusky

[57] ABSTRACT

In a wireless local area network, predetermined interference-detection sequences of signal points, known at both the transmitter and receiver, are transmitted over a plurality of hopping frequencies along with a sequence of data signal points taken from a modulated code exhibiting built-in diversity. In the receiver, the extent to which there are errors in the received interference-detection signal points is used as a mechanism for identifying the likely occurrence of strong interference. If there are no, or few, errors, decoding proceeds normally. However, if the number of errors is above a predetermined threshold, it is assumed that the transmitted signal was subjected to significant interference and an erasure is declared. This is used as "side" information by the decoder to improve its ability to accurately recover data in the presence of interference. Particular modulated codes are found by mapping each signal point of a "base" modulated code into a group of signal points.

31 Claims, 8 Drawing Sheets

| INPUT BIT PATTERN | 4D-SUBSET PAIR |
|---|---|
| 0 0 | $(S_0, S_0)$ |
| 0 1 | $(S_1, S_2)$ |
| 1 0 | $(S_2, S_1)$ |
| 1 1 | $(S_3, S_3)$ |

FIG. 11

| INPUT BIT PATTERN | CODEWORD |
|---|---|
| 0 0 0 0 | 0 0 0 0 |
| 0 0 0 1 | 0 1 2 3 |
| 0 0 1 1 | 0 2 3 1 |
| 0 0 1 0 | 0 3 1 2 |
| 0 1 1 1 | 1 0 3 2 |
| 0 1 1 0 | 1 1 1 1 |
| 0 1 0 0 | 1 2 0 3 |
| 0 1 0 1 | 1 3 2 0 |
| 1 1 0 0 | 2 0 1 3 |
| 1 1 0 1 | 2 1 3 0 |
| 1 1 1 1 | 2 2 2 2 |
| 1 1 1 0 | 2 3 0 1 |
| 1 0 1 1 | 3 0 2 1 |
| 1 0 1 0 | 3 1 0 2 |
| 1 0 0 0 | 3 2 1 0 |
| 1 0 0 1 | 3 3 3 3 |

FIG. 12

| BASE SIGNAL POINT | MAPPED GROUP OF SIGNAL POINTS |
|---|---|
| 0 | 0 0 |
| 1 | 1 1 |
| 2 | 2 2 |
| 3 | 3 3 |

FIG. 13

| BASE SIGNAL POINT | MAPPED GROUP OF SIGNAL POINTS |
|---|---|
| 0 | 0 0 |
| 1 | 1 2 |
| 2 | 2 1 |
| 3 | 3 3 |

DIVERSITY CODED MODULATION

BACKGROUND OF THE INVENTION

The present invention relates to coded modulation techniques and, more particularly, to the use of modulated codes that exhibit diversity.

During the past decade, trellis-coded modulation has proven to be a practical power-efficient and bandwidth-efficient modulation technique for channels with additive white Gaussian noise (AWGN). This technique has now been widely used in commercial telephone-line modems and has resulted in an increase of line rates of those modems to as much as 19.2Kbits/s.

The prior art has further recognized that it is possible to take into account the occurrence of fades in the channel—and thereby provide enhanced coding gain via the use of particular trellis codes exhibiting so-called "built-in diversity." In addition my co-pending U.S. pat. applications, Ser. Nos. 386,185, filed July 28, 1989, now U.S. Pat. No. 5,029,185, and 07/459,880, now U.S. Pat. No. 5,048,057 filed of even date herewith co-inventor A. Saleh and entitled "Wireless Local Area Network," teach that it is possible to also take into account the occurrence of strong interference and that not only trellis codes, but also block codes with built-in diversity can be used in such applications.

In general, a block code is said to have X-fold diversity, where X is an integer greater than unity, if each codeword, which is comprised of an ordered finite sequence of signal points, differs from each other codeword at at least X signal point positions. Advantageously, the larger the value of X, the greater the so-called coding gain, which is measured by the savings in signal power over an uncoded modulation scheme. The X-fold diversity of a trellis code may be similarly defined, the only difference being that, strictly speaking, each "codeword" of a trellis code is made up of an infinite sequence of signal points. For practical purposes, however, the "codeword" length of a trellis code may be taken to be the so-called "decoding depth" of the trellis code, which is finite.

Among the requirements in a particular coded modulation system is the level of diversity (i.e., the value of X) that is deemed necessary in order to achieve a given level of performance. Indeed, it is always possible to generate either a trellis or block code that will provide that performance level. The straightforward approach, more particularly, would be to design a code having the desired level of diversity and which, at the same time, maximizes, to the extent achievable, such other parameters as the data rate.

SUMMARY OF THE INVENTION

In accordance with the present invention, I have realized that the above-described approach of the prior art in designing codes having a given level of diversity may not always be the best. In particular, implementation of codes arrived at following the prior art approach may entail a complexity in, for example, processing time or circuitry that is not tolerable in a real-world application.

In particular, I have realized that an advantageous way to provide a code having virtually any level of diversity can be achieved with only a very modest increase in complexity (as shown hereinbelow) by taking a "base" code having a lower level of diversity and forming a new, expanded code by mapping each signal point generated by the base code into a group of R (not-necessarily-contiguous) signal points of the expanded code, where R > 1. In the case of block codes, for example, this mapping can be carried out by simply forming, as each codeword of the expanded code, the concatenation of a codeword from the base code with itself. Assuming that the base code has diversity X, then the expanded code will have diversity (R×X), provided only that any two of the groups of R signal points differ from each other at all signal point positions.

Codes with (R×X)-fold diversity formed in accordance with the invention may not achieve as large a data rate, say, as codes with the same level of diversity formed using the prior art code design methodology. Advantageously, however, the sacrificing of data rate or other design parameters in order to contain the complexity may be a highly desirable engineering tradeoff in particular applications.

DETAILED DESCRIPTION

Figure 1:
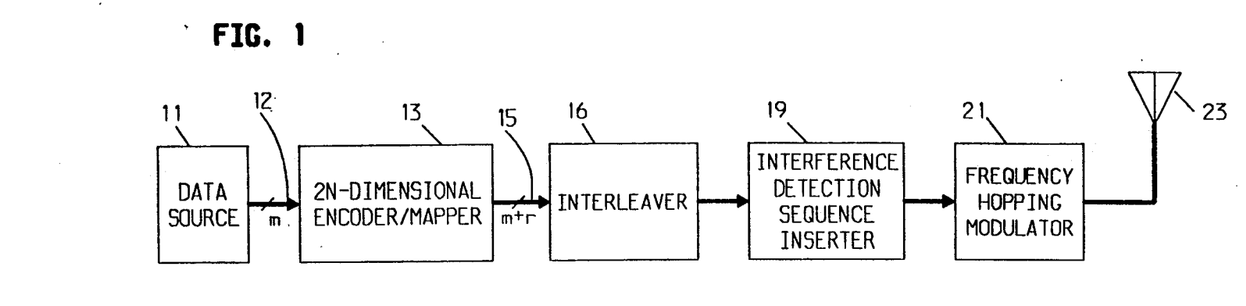
FIG. 1 is a block diagram of a transmitter which uses a code embodying the principles of the invention.

The transmitter of FIG. 1 is illustratively a part of a wireless local area network (LAN) which can be used, for example, to interconnect a collection of terminals, such as PCs, printers, file servers and the like, which are located within a localized environment, such as an office building. Alternatively, the LAN could be used as the interconnection mechanism for a wireless communication system, such as a PBX. Radio signals generated by the transmitter are received by a receiver, shown in FIG. 2, which is within the geographical area covered by the LAN.

In the transmitter of FIG. 1, data from a binary data source 11 is applied to 2N-dimensional block encoder/mapper 13 at a rate of m bits per T-second signalling interval. Block encoder/mapper 13 accumulates a block of input data comprised of N signalling intervals' worth of bits and then uses a particular 2N-dimensional block code to encode the accumulated N×m bits into N groups of (m+r) encoded bits, those groups being provided successively on leads 15. Here, the parameter r is the average number of redundant bits per signalling interval introduced by the block encoder/mapper 13. Each allowed bit pattern of the (m+r)-bit group is associated with a particular signal point of a two-dimensional (2D) $M(\leq 2^{m+r})$-PSK constellation. The block code is referred to as being "2N-dimensional" because each signal point has 2 dimensions and each "codeword" output by the block encoder/mapper 13 is represented by N signal points.

Figure 7:
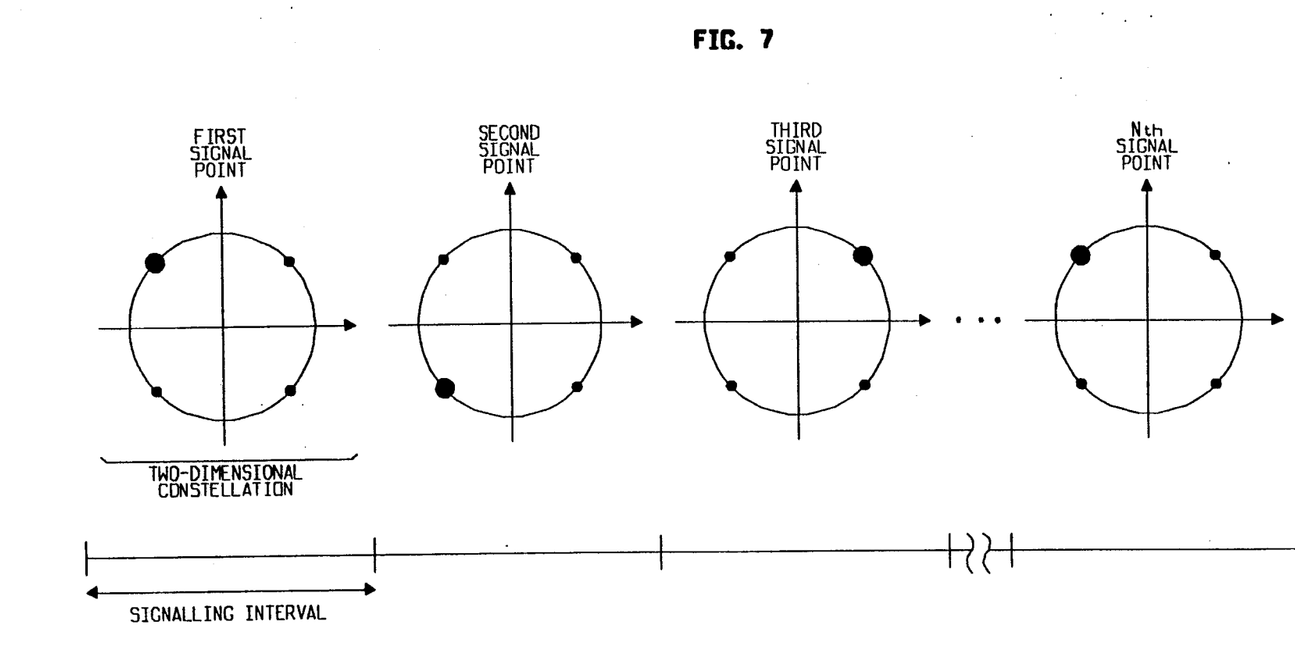
FIG. 7 is a chart which helps explain certain terminology and concepts.

Attention is directed briefly to FIG. 7 which will be helpful in understanding certain of the terminology and concepts used herein. The 2N-dimensional block encoder/mapper generates 2N-dimensional "codewords". Each codeword is comprised of a block of N coded modulation "signal points". Each signal point is a point in a predetermined two-dimensional "constellation"—illustratively shown in FIG. 7 as a phase shift keying constellation having four signal points, or 4-PSK. This 2N-dimensional codeword is delivered during N "signalling intervals," one signal point in each signalling interval. The assemblage of all 2N-dimensional codewords is referred to as the "2N-dimensional constellation," with each codeword being an "element" of the 2N-dimensional constellation. The 2N-dimensional constellation is also referred to as a codebook or as an alphabet.

The code is constructed in such a way, as described below, as to have so-called built-in diversity. As described below, this diversity is exploited in the illustrative embodiment by the use of frequency hopping transmission in which at least particular signal points of a codeword—those which exhibit the diversity—are transmitted using different transmission frequencies. These frequencies are sufficiently spaced apart to ensure that they fade independently, thereby taking advantage of the diversity built into the code. In other possible embodiments, the diversity of the code could be exploited using, for example, time diversity, space diversity, polarization diversity, or various combinations thereof.

The signal points output by encoder/mapper 13 are thereafter rearranged by interleaver 16 in order to reduce the rate at which the system needs to switch from one hopping frequency to another, as will also be further described.

The interleaved signal points are thereupon operated on by interference-detection-sequence inserter 19 which, as its name implies, combines a predetermined sequence of interference-detection signal points with the interleaved data signal points in a deterministic way. This sequence of interference-detection signal points is used later, in the receiver, to identify the likely occurrence of interference whose strength is comparable to, or even stronger than, the transmitted signal. The resulting combined signal point stream at the output of inserter 19 is then passed to frequency hopping modulator 21, which modulates the signal points—illustratively using M-ary PSK—and applies the resulting radio signal to antenna 23.

Figure 3:
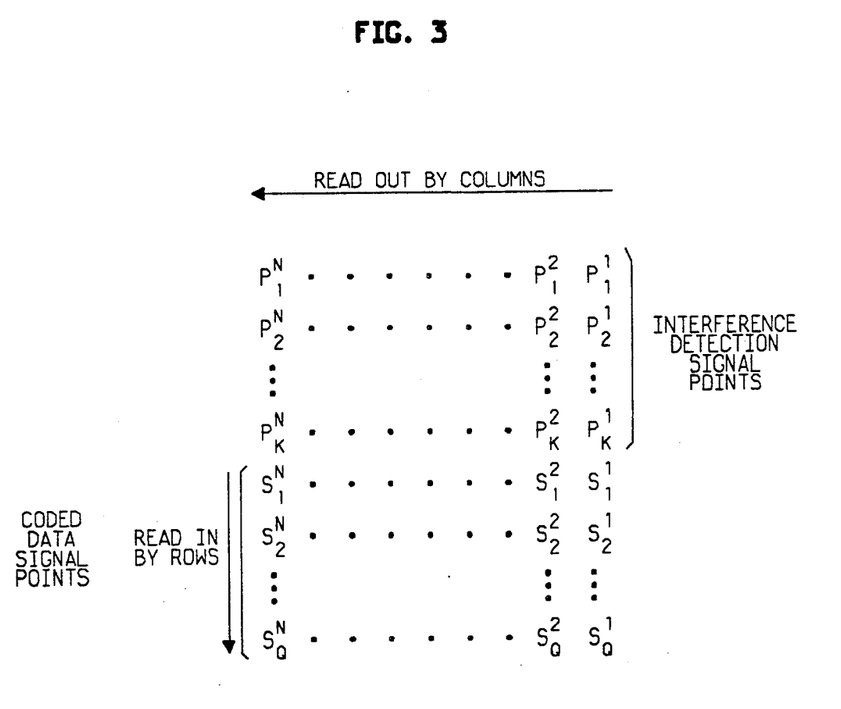
FIG. 3 depicts one way in which the transmitter of FIG. 1 interleaves coded data signal points and combines them with interference-detection signal points.

FIG. 3 shows one possible way in which the coded data signal points are interleaved and the interference-detection sequence is combined therewith. The N signal points of the $i^{th}$ codeword are denoted $S_i^1, S_i^2, \ldots, S_i^N$. Q such codewords are read into interleaver 16 and may be thought of as being stored in rows. In addition, inserter 19 has stored therein N interference-detection sequences of K signal points each, the $j^{th}$ one of these being denoted $P_1^j, P_2^j, \ldots, P_K^j$, $j=1, 2, \ldots, N$. Each of the N interference-detection sequences may be identical to one another. Illustratively, N=8. Q is illustratively on the order of a few hundreds and K is on the order of 10–30.

Figure 5:
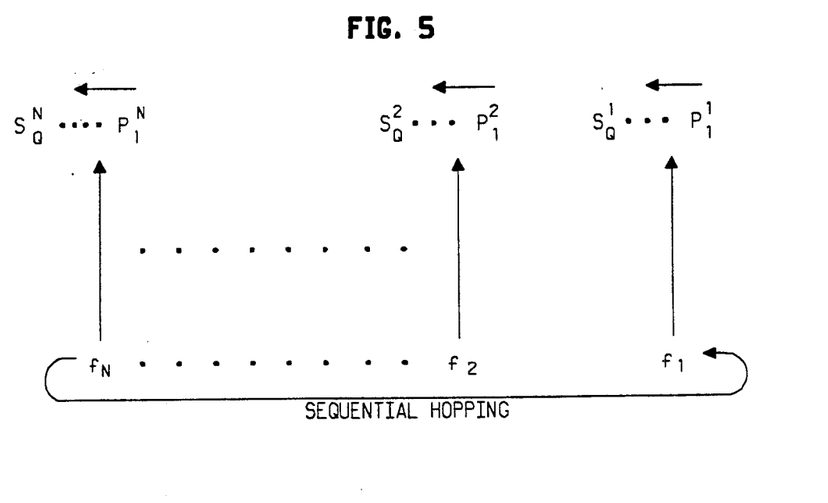
FIG. 5 depicts the sequential frequency hopping performed by the transmitter of FIG. 1.

Inserter 19 operates in such a way as to provide to modulator 21 a first sequence comprised of interference-detection signal points and coded data signal points to be transmitted using frequency $f_1$, another such sequence to be transmitted using frequency $f_2$, and so forth for each of the N frequencies. This process may be conceptualized, as shown in FIG. 3, as reading out the columns of signal points and transmitting the signal points from each column using a respective frequency. Thus, for example, inserter 19 outputs to modulator 21, for transmission using frequency $f_1$, the sequence of K interference-detection signal points, $P_1^1, P_2^1, \ldots, P_K^1$. It thereafter reads in from interleaver 16—and passes through to modulator 21—the Q coded data signal points $S_1^1, S_2^1, \ldots, S_Q^1$. It then repeats the process for each of the other N-1 frequencies and then begins again for frequency $f_1$. In this way, there is transmitted on each of the hopping frequencies a) a preamble sequence of K interference-detection signal points and b) a sequence of Q coded data signal points each from a different codeword. This is graphically depicted in FIG. 5, which shows that the transmitter hops sequentially among the N hopping frequencies and further shows the interference-detection and coded data signal points transmitted using each frequency.

Although the interference-detection signal points can be included in the transmitted signal point stream in the form of a preamble as just described, it is also possible to distribute the interference-detection signal points among the coded data signal points transmitted on each frequency so that they are transmitted non-time-contiguously. This distributed approach provides improved performance over the preamble approach, as will be described in further detail hereinbelow.

Figure 4:
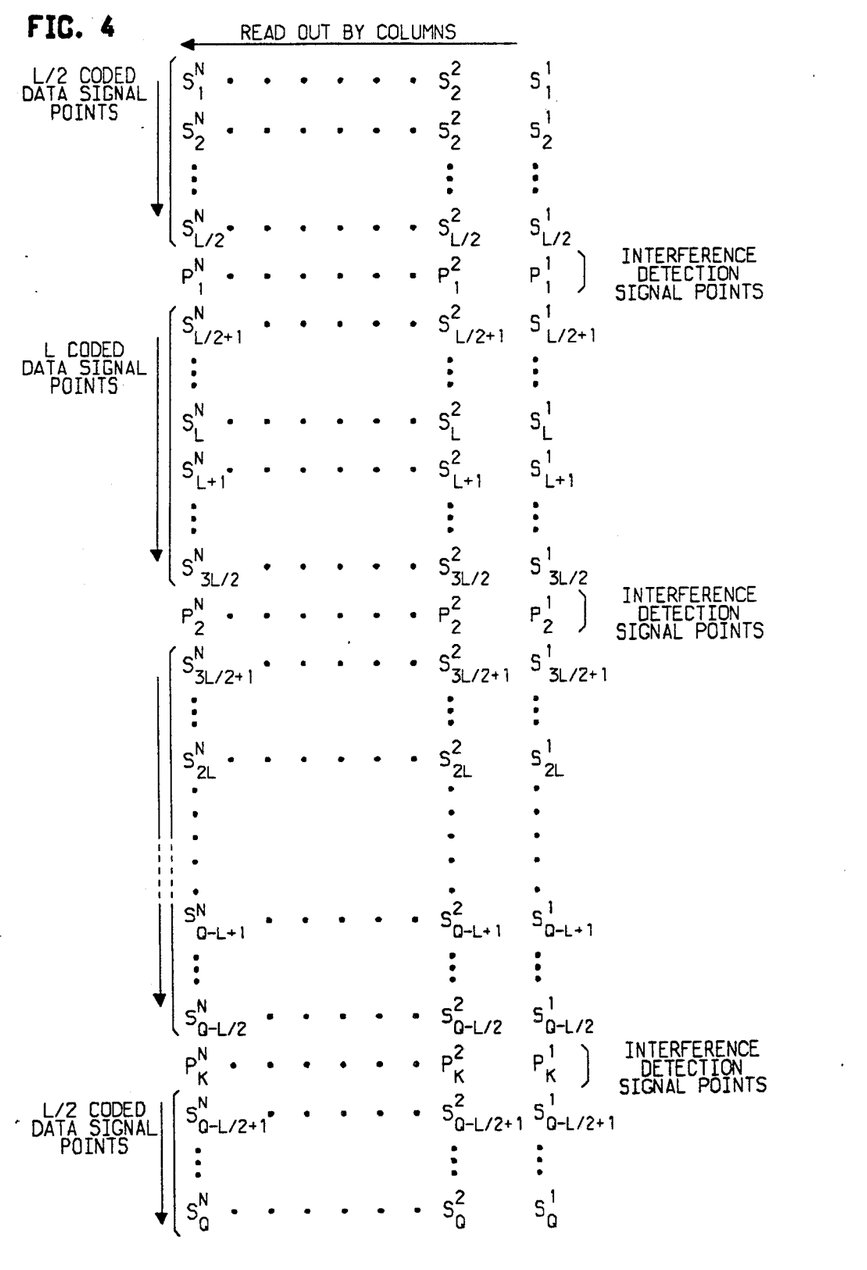
FIG. 4 depicts a second way in which the transmitter of FIG. 1 interleaves coded data signal points and combines them with interference-detection signal points.

A conceptual view of the distributed approach is provided in FIG. 4. As before, the codewords can be thought of as being read into the interleaver and stored therein in rows. Now, however, the K rows of interference-detection signal points are interspersed among the Q rows of data signal points, rather than being grouped together as in FIG. 3. Illustratively, a row of interference-detection signal points is inserted in the middle of each group of L=Q/K data signal point rows. Thus the sequence of signal points transmitted on each frequency is comprised of K groups, each group being comprised of L/2 coded data signal points, one interference-detection signal point, and then another L/2 coded data signal points.

Figure 2:
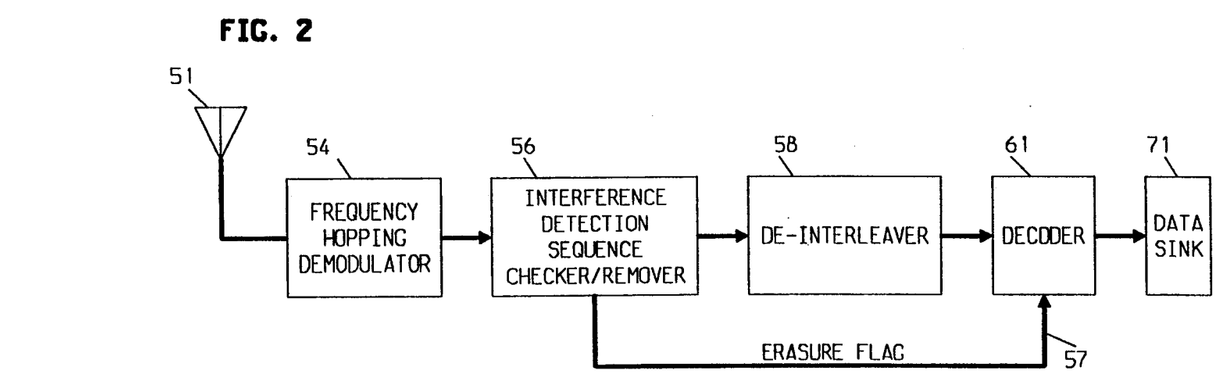
FIG. 2 is a block diagram of a receiver for the signals transmitted by the transmitter of FIG. 1.

Turning now to the receiver of FIG. 2, the transmitted signal, received at antenna 51, is applied to frequency hopping demodulator 54, which hops in synchronism with modulator 21. Demodulator 54 generates a stream of noisy received signal points corresponding to the transmitted signal points output by inserter 19. This stream of received signal points is passed to interference-detection sequence checker/remover 56, which makes a so-called "hard" decision for each received interference-detection signal point, i.e., chooses the point of the M-PSK constellation that is closest to the received point and compares it to the transmitted such signal point which is known, a priori, at the receiver. The number of interference-detection signal points in error is counted for each sequence and the count is used as a mechanism for identifying signal points that are likely to have been subject to strong interference. If the number of errors is above a predetermined threshold, it is assumed that the transmitted signal was subjected to strong interference and, in this case, the occurrence of strong interference is declared by raising an erasure flag on lead 57—that flag to be used by decoder 61 as hereinafter described. If the number of errors is not above the predetermined threshold, no strong interference is assumed to have occurred and the erasure flag is not raised. In summary, then, the erasure flag is a signal indicative of the presence of strong interference in the block of coded modulation signal points transmitted over a given frequency, which signal is generated as a function of the error rate of the associated received interference-detection signal points.

The principal reason for preferably distributing the interference-detection signal points among the coded data signal points transmitted on each frequency can now be understood. If the preamble approach were to be used, and if an interference event were to occur after the preamble had been transmitted, the erasure flag would not be raised, even though an interference event affecting the coded data signal points had occurred. By contrast, the distributed approach allows the receiver to raise the erasure flag at any point during the signal point sequence received at a given frequency—thereby enhancing the performance of the technique as a whole.

Checker/remover 56 thereupon removes the information corresponding to the interference-detection signal points and passes the remaining part—corresponding to the coded data signal points—to de-interleaver 58. The latter performs the inverse operation of interleaver 16 so as to deliver to decoder 61 the signal points corresponding to the transmitted coded data signal points in the order in which those signal points were generated by encoder 13, i.e., in sequences of N-signal-point codewords. Decoder 61, in turn, attempts to recover the original binary data provided by data source 11, which it provides to data sink 71.

As noted above, a decoder used in a diversity coded modulation system—in this example, decoder 61—can exhibit better error performance in the presence of strong interference if it is made aware of the occurrence of that interference—in this example, via the erasure flag on lead 57. This can be understood by referring to FIG. 6. A 4-level, PSK (4-PSK) modulation scheme is assumed in which the nominal received signal points are the points A, B, C, and D. Assume, now, that point A was transmitted but that, due to a fade in the transmission channel, the received signal is attenuated so that the received point is point F. Note that although the amplitude of the signal point is substantially reduced, the phase information has not been affected. This being so, it is advantageous to use the position of point F as input to the decoding process because there is still some correlation between the signal point positions of the transmitted and received signal points.

Figure 6:
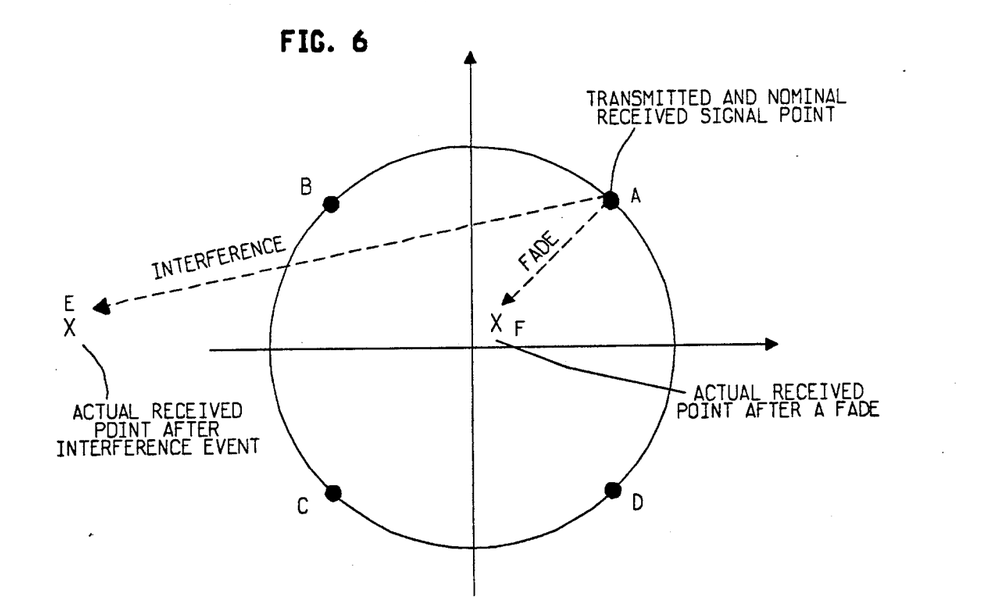
FIG. 6 illustrates the effects of fading and interference on the signal points transmitted by the transmitter of FIG. 1.

On the other hand, assume that due to strong interference in the transmission channel, the received signal point is now the point E, whose position bears little if any information about the transmitted point. In this case, it would be better for the decoder to assume a neutral posture and allow for the possibility that any of the four points A, B, C or D was transmitted, rather than to be biased with wholly erroneous information, which in this case would tend to bias the decoder toward point B.

The erasure flag on lead 57 is generated with just such considerations in mind. Note that as long as a fade is not very deep (i.e., the received signal point is not very close to the origin in FIG. 6) additive noise will not change the complex signal plane quadrant of very many of the transmitted points. Accordingly, checker/remover 56 will make few (hard-decision) interference-detection signal point errors. Thus, as desired, a fade event is not likely to cause the erasure flag to be raised and decoder 61 will proceed to use the actual received signal points in its normal decoding process.

On the other hand, a strong interference event is likely to result in many interference-detection signal point errors in checker/remover 56 and thus, as desired, the erasure flag will be raised. Responsive to the flag, decoder 61 will ignore those signal points received in time proximity to the interference event. That is, it will perform its decisions as to the values of the transmitted coded modulation signal points independently of the received values of those signal points that were subject to the strong interference.

Various block coded modulation schemes embodying the principles of the invention that can be used in the system of FIGS. 1-2 will now be described. For simplicity, such schemes will be referred to as "codes".

We begin by describing a particular so-called "base" code. This code is formed using the 4-PSK signal constellation shown in FIG. 8. This base code is an 8-dimensional (8D) code, meaning that each codeword generated by the code is comprised of four 2D points, each point being taken from the 4-PSK constellation. The four points of the constellation are labelled 0 through 3.

Figure 8:
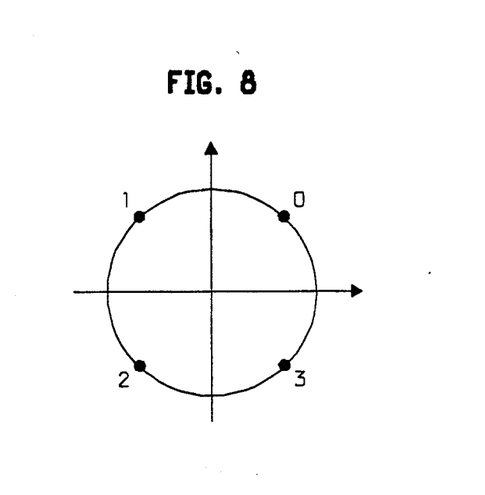
FIG. 8 shows a 4-PSK signal constellation that forms the basis of illustrative modulated codes embodying the principles of the invention.
Figure 9:
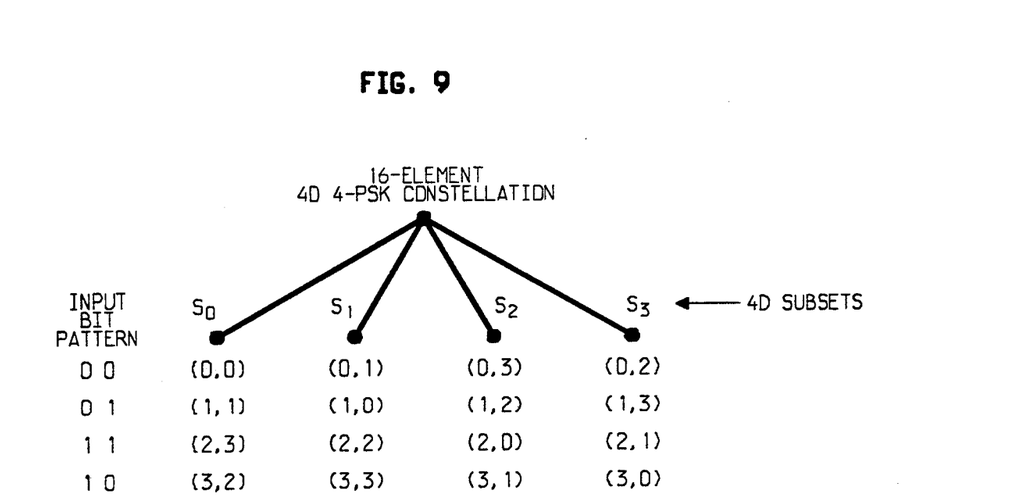
FIGS. 9-13 graphically depict these codes.
Figure 10:
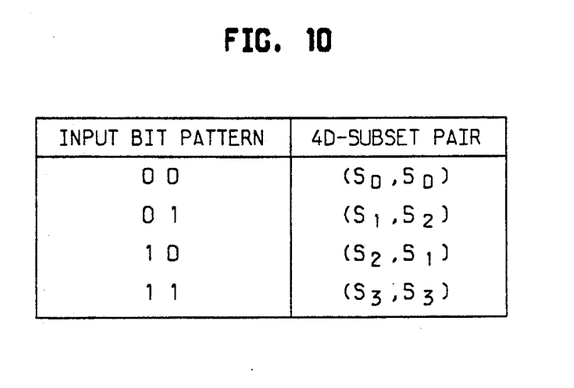

A graphical representation of the base code is shown in FIGS. 9 and 10. We start to form the base code by first defining a constituent 4D 4-PSK constellation which is formed by concatenating a pair of 2D 4-PSK constellations of the type shown in FIG. 8. An 8D constellation is then formed by selecting particular elements from a concatenated pair of the 4D constellations. Each element of the 8D constellation is a sequence of four 2D signal points and is a codeword of the 8D base code.

In particular, we select all of the $4 \times 4 = 16$ possible 4D elements for inclusion in the 4D constellation. As shown in FIG. 9, the 16 elements of the 4D constellation are partitioned into four subsets $S_0, \ldots, S_3$.

Finally, we select one-fourth of the $16 \times 16 = 256$ possible 8D elements for inclusion in the 8D constellation. These 256 elements are the elements in the four 4D-subset pairs shown in the table of FIG. 10. Specifically, the concatenation of a particular pair of 4D elements is an element of the 8D constellation if and only if the pair of 4D subsets to which the first and second 4D elements belong respectively is one of the four patterns shown in FIG. 10. Thus, for example, (0,1,1,2) is a codeword of the 8D base code because a) (0,1) and (1,2) are elements of 4D subsets $S_1$ and $S_2$, respectively, and b) the pattern $(S_1, S_2)$ is one of the four allowed patterns of 4D-subset pairs. On the other hand, (0,1,0,1) is not a codeword of the 8D base code because a) (0,1) is an element of subsets $S_1$ and b) the pattern $(S_1, S_1)$ is not one of the four allowed patterns of 4D-subset pairs.

Since the 8D base code has 64 codewords, this code is capable of communicating six information bits per codeword. In general, any scheme for assigning the bit patterns to particular codewords could be used. FIG. 9-10 show one possible way in which two of the six bits are first used to select one of four 4D subset pairs from FIG. 10 and then two bits to select one of the four pairs of 2D signal points from one of the selected 4D subsets and likewise for the other selected 4D subset, for a total of six bits overall.

At this point, the built-in diversity of the base code can be seen. In particular, it will be observed that each of the 8D codewords differs from any other 8D codewords in at least two signal point positions. Thus, for example, the two 8D codewords (0,1,1,2) and (0,1,2,0) differ in the third and fourth signal point positions. The significance of this property may be understood by considering the case when one of the four constituent signal points is lost in transmission. It is nonetheless possible to recover that information as long as the other three constituent signal points of the 8D codeword have been accurately recovered. In particular, if the fourth signal point of the codeword (0,1,1,2) is lost, then as long as the first three signal points are correctly received, that codeword can nonetheless be determined to have been (0,1,1,2) because no other codeword has 0, 1, and 1 as its first, second and third signal points, respectively. (This analysis is an oversimplification of how the decoding process is preferably carried out, but is useful for purposes of explanation.) Thus it is seen that this base code provides built-in enhanced immunity to transmission errors via the mechanism of built-in diversity. That is, information appears redundantly within the coded signal.

In general, a code is said to have X-fold diversity, where X is an integer greater than unity, if each codeword, which is comprised of an order sequence of signal points, differs from each other codeword in at least X signal point positions. It will thus be appreciated that the above-described code has 2-fold built-in diversity. Advantageously, the larger the value of X, the greater the so-called coding gain, which is measured by the savings in signal power over an uncoded modulation scheme.

With more specific reference to the system of FIGS. 1-2, then, it will be seen that the signal points which provide the X-fold diversity should be transmitted in at least two—and preferably X—different which are sufficiently separated that they are likely to fade independently. In the above code, for example, the 2-fold divesity of the code may occur at any pair of signal point positions. That is, for any pair of signal point positions, there exists a pair of codewords which differ in exactly that pair of signal point positions. Thus in order to exploit the 2-fold diversity of this code, the four signal points of a codeword should be transmitted in four independently fading frequencies.

Another parameter that is useful to characterize and compare different codes is referred to herein as the "minimum squared Euclidean distance at X-fold time diversity" or MDX, which is defined as the minimum squared Euclidean distance between any two codewords which differ from each other at exactly X signal point positions. In general, the larger this distance, the greater the coding gain. The MDX of this code is 4—assuming a unity radius for the constellation of FIG. 8.

In particularly hostile signalling environments, 2-fold built-in diversity such as is provided by the base code just described may be regarded as inadequate to provide a given level of error performance. In such applications, it may be desirable to enhance the error immunity of the system by using a code with 3-fold, 4-fold, or greater built-in diversity. The straightforward approach that would be taken in the prior art in this case would be to design a code having the desired level of diversity and which, at the same time, maximizes, to the extent achievable, such other parameters as m or MDX.

In accordance with the present invention, I have realized that the above-described approach of the prior art in designing codes having a given level of diversity may not always be the best. In particular, implementation of codes arrived at following the prior art approach may entail a complexity in, for example, processing time or circuitry that is not tolerable in a real-world application.

In particular, I have realized that an advantageous way to provide a code having virtually any level of diversity can be achieved with only a very modest increase in complexity (as shown hereinbelow) by taking a "base" code having a lower level of diversity—such as the code just described—and forming a new, expanded code by mapping each signal point generated by the base code into a group of R (not-necessarily-contiguous) signal points of the expanded code, where R>1. Assuming that the base code has diversity X, then the expanded code will have diversity (R×X), provided only that any two of the groups of R signal points differ from each other at all signal point positons, as described more fully hereinbelow.

This approach is not optimum; from a coding theory standpoint, codes of any particular dimensionality can be developed which achieve a higher data rate (larger m) and/or better performance (larger X and/or larger MDX) than codes developed in accordance with the invention. However, such enhancements may come only at the cost of substantially higher system complexity—particularly in the decoder. By contrast, the present invention introduces only a modest increase in complexity and may be preferred in many applications.

A particular way that the aforementioned mapping can be carried out is by forming each codeword of the expanded code by repeating each point of the base codeword R times.

Figure 12:
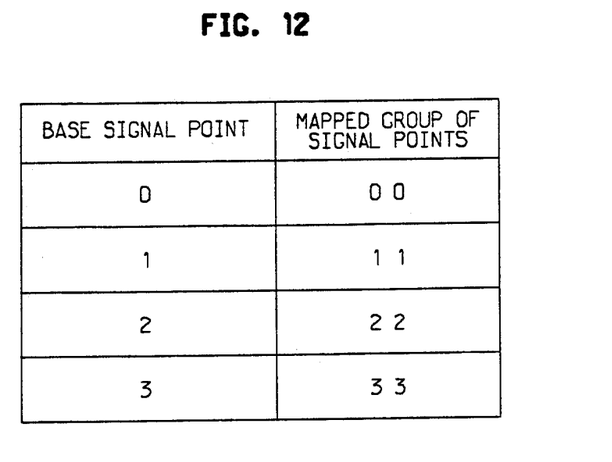

The repeated points can, for example, be adjacent in the expanded codewords. Thus using the 8D base code described above, one can form a 16D code one of whose codewords is (0,0,1,1,1,1,2,2), which is formed by repeating each signal point from the codeword (0,1,1,2) of the 8D base code, and so on for each of the base codewords. Such mapping is illustrated in FIG. 12, which shows that the signal points 0,1,2 and 3 are mapped into the signal point pairs 00, 11, 22 and 33. This, of course, is a case for which R=2.

Alternatively, the signal point repetition may be carried out in such a way that each expanded codeword is comprised of R concatenations of a particular codeword of the base code with itself, this being referred to herein as "codeword repetition." Using this approach would result in a 16D code one of whose codewords is (0,1,1,2,0,1,1,2), which is formed by repeating the codeword (0,1,1,2) of the 8D base code.

In the most general case, the repeated signal points can be ordered in any desired way to form the expanded codeword (as long as the same ordering scheme is used for all codewords). In any event, it can be shown that all such codes exhibit 4-fold built-in diversity (X=4) because each pair of 16D codewords differs in at least four signal point positions. For this specific code, m=$\frac{3}{4}$, r=1$\frac{1}{4}$ and N=8. In addition, its MDX is 8. In generating the 16D codewords, block encoder/mapper 13 generates a sequence of eight 2-bit pairs, each such pair identifying, by its bit values, a particular one of the signal points 0 through 3.

Figure 13:
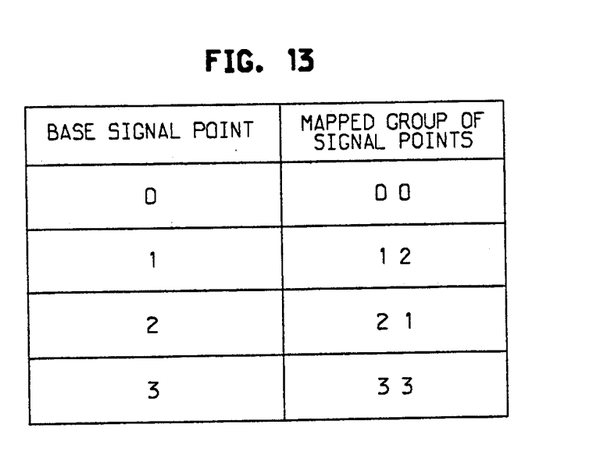

The more general case of mapping each signal point of the 8D base code into a group of R=2 signal points is shown in FIG. 13. Rather than simply repeating each base codeword signal point, the mapping can be random, provided only that any two of the groups of two signal points differ from each other at both signal point positions. (This is, in fact, the case for the mapping shown in FIG. 13 and, indeed, happens automatically when signal point repetition, such as shown in FIG. 12, is used.) Such an approach provides some enhanced performance of the 16D code because the Euclidean distance between the mapped groups of signal points corresponding to base signal points 0 and 1 is greater in FIG. 13 than in FIG. 12. An example of the application of the mapping of FIG. 13 would be the mapping of the base codeword (0,1,1,2) into the expanded codeword a) (0,0,1,2,1,2,2,1) when the signal points of the mapped groups are contiguous to one another, or b) (0,1,1,2,0,2,2,1) when the corresponding (i.e., first, second, etc.) signal points of the mapped groups are grouped together.

A number of different 8D base codes based on a 4-PSK constellation and having the same 2-fold diversity can alternatively be used in place of the 8D base code just described. Such base codes may be formed by, for example, partitioning the 16-element 4D conestellation into various different groups of four subsets; by forming the 8D constellation by choosing various different 4D subset pairs. Any such base codes are preferably constructed keeping in mind the desirability of being able to decode them simply using, for example, the soft-decision decoding technique described below.

Figure 11:
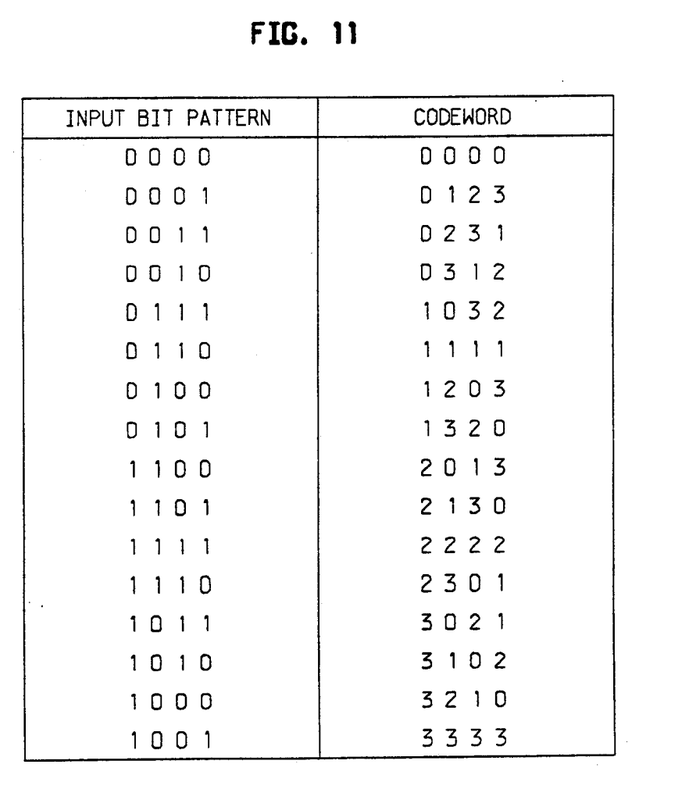

Another possible 8D base code is that depicted in the table of FIG. 11. This is another code based on the 4-PSK constellation of FIG. 8. This code exhibits 3-fold diversity (X=3), and has an MDX of 8—which is the maximum MDX achievable for a base code with these characteristics.

The base code of FIG. 11 is comprised of 16 codewords, which are shown along with the 4-bit input patterns associated therewith. Each codeword is made up of a sequence of four 2D signal points from the 4-PSK constellation, those points, again, being identified as points 0,1,2 and 3.

The 8D base code of FIG. 11 was constructed by first constructing the 4D constellation made up of all sixteen possible pairs of the 2D signal points of the 2D constellation of FIG. 8. As before, the 4D constellation is then partitioned into subsets. In this case, there are 16 subsets, each having a single 4D element. Each of those 16 subsets may, therefore, be identified by its 4D element, viz., (0,0), (0,1), . . . , (3,3). The 8D constellation is then formed by selecting 16 of the 256 possible 4D subset pairs. Thus, for example, (0,2,3,1) is an 8D codeword formed by concatenating the two 4D subsets (0,2) and (3,1). On the other hand, the 8D element (0,1,3,1)—which is a concatenation of the two 4D subsets (0,1) and (3,1)—is not one of the selected 16 codewords.

As before, an expanded, 16D code can be created from the 8D base code of FIG. 11 by mapping each of the 2D signal points of the 8D base codewords into a group of, illustratively, two points to form the 16D codewords of the expanded code. This mapping can be carried out using any of the approaches described above for expanding the 8D base code of FIGS. 9-10 into an expanded, 16D code. Such expanded codes formed from the base code of FIG. 11 have $m=\frac{1}{2}$, $r=1\frac{1}{2}$, $N=8$, exhibit 6-fold diversity (X=6), and have an MDX of at least 16.

We turn, now, to the decoding process performed in decoder 61—illustratively a soft-decision decoding process—which can be used for all of the codes described herein.

It is assumed that, prior to performing the steps about to be described, the decoder checks to see if an erasure flag was generated for any of the hopping frequencies. If so, it takes steps to treat signal points received from such erased frequencies as though those signal points were at the origin. The preferred way to do this is to simply ignore the erased signal points when the metrics computations decribed below are performed.

In order to understand how the decoding process operates on the expanded, 16D codes, it will be useful to describe how it would decode the 8D base codes if those codes were, in fact, used for transmission.

The decoding proceeds by examining each 2D point of a particular received signal corresponding to a transmitted 2N-dimensional codeword. In particular, so-called "2D point metrics" are computed for each received 2D point by measuring the squared Euclidean distance between the received point and all possible points of the M-PSK constellation. In preforming this calculation, a particular radius of the received constellation is assumed and the receiver is provided with a gain control (not shown) which is set so as to provide an output constellation whose average radius is at least approximately equal to the radius assumed in the decoding. The performance of the decoder is not sensitive to the exact setting of this received constellation radius. Moreover, in order to de-emphasize the contribution of a faded—and therefore potentially unreliable—received signal point to the decoding process, each of the 2D point metrics may be weighted by a factor proportional to the amplitude of the corresponding received 2D point.

(The above-described part of the decoding process is advantageously carried out in the manner described above when the strong interference events are of relatively long duration and, thus, detectable via the mechanism described hereinabove. However, when the duration of the interference events is too short to be reliably detected, the overall performance of the decoder may be severely degraded. This is due to the fact that the signal points that have been subjected to the strong interference are not ignored in the decoding process as they would be if the interference had, in fact, been detected. In environments in which at least some short-duration interference is likely, the above-described part of the decoding process may be advantageously modified so as to ameliorate such effects. In particular, the received signal may be subjected to a significant amount (e.g., 10 dB) of clipping before the 2D point metrics are computed. Moreover, the 2D point metrics, once calculated, are also clipped, at least to a moderate extent. Both of these steps have the effect of limiting the impact on the decoding process of those signal points that are subjected to undetected strong interference.)

The N 2D received signal points corresponding to the transmitted codeword are sequentially grouped into N/2 4D elements, each of which are then further processed as follows: We find, for each 4D subset (used in the construction of the code as described above), the one 4D element of that subset which is "closest" to the received 4D element being processed. This is achieved by taking each element of the 4D subset in turn and forming the sum of the two 2D point metrics corresponding to that element. The 4D element corresponding to the smallest such sum—referred to below as the "4D subset metric"—is then identified as the "closest" 4D element. The result to this point, then, is the identification, for each of the received 4D elements, of a particular 4D element and its associated 4D subset metric for each 4D subset.

If the code is a 4D code, then there is only one 4D subset. Thus only one 4D element has been identified and that element is taken to be the transmitted codeword. If the code is an 8D or greater code, the above process iterates for each of the received 8D elements.

In particular, the received N/2 4D received elements are sequentially grouped into N/4 8D elements, each of which is then processed in a manner analogous to the 4D case. In particular, we find, for each 8D subset, the one 8D element of that subset which is "closest" to the received 8D element being processed. This is achieved by taking each 4D subset pair in the 8D subset in turn and forming the sum of the two 4D subset metrics corresponding to that pair. The 8D element in the 4D subset pair—which is the pair of 4D elements, one element, for each 4D subset, obtained from the previous step—corresponding to the smallest such sum—referred to as the "8D subset metric"—is then identified as the "closest" 8D element.

If the code is an 8D code, then a single 8D element has now been identified. Otherwise, the process is again iterated for 16D, and so forth.

The identified codeword is then mapped into data bits based on the bit assignment scheme associated with the code.

Consider, next, the case of the expanded codes. The first step of the decoding process is, for each of the N signal points of a received 2N-dimensional signal, to compute a "preliminary" 2D point metric corresponding to each point of the M-PSK constellation. The N received signal points are then grouped into N/R groups with R points in each group. Each group of R received signal points is the channel-impaired version of the group of R transmitted signal points that was mapped from a corresponding base signal point of a codeword of the 2N/R-dimensional base code. We then, for each of the N/R groups of R received signal points, compute a "final" 2D point metric corresponding to each of the M possible values of the corresponding base signal point (see, for example, the first column of FIG. 12 or FIG. 13). The "final" 2D point metric for a particular value of the corresponding base signal point is simply the sum of the R preliminary 2D point metrics associated with the group of R signal points mapped from that particular value of the corresponding base signal point (see, for example, the second column of FIG. 12 or FIG. 13). These "final" 2D point metrics are then subsequently used as the 2D point metrics in the decoding process described above for the 2N/R dimensional base code. Thus, for example, consider the case of expanded codes built on the base code of FIGS. 9–10 which use the mapping of FIG. 13 and which have the two signal points of each mapped group contiguous with one another in the expanded codeword. In this case, for the first received signal point, we calculate four preliminary 2D point metrics for each of the four signal points 0,1,2 and 3 of the 4-PSK constellation. We do the same thing for the second received signal point. The two preliminary 2D point metrics associated with the group of two signal points that is mapped from each particular value of the corresponding base signal points, as shown in FIG. 13, are then added together to become the aforementioned final 2D point metric for that particular value of the first base signal point to be used in the decoding of the 8D base code.

The above-described process is based on so-called "soft" decisions. It will be remembered that a so-called "hard" decision approach was used for the interference-detection signal points by processing each received signal point in isolation. In soft decision decoding, by contrast, a decision as to value of each transmitted signal point is made based on Euclidean distance metrics calculated with respect to not just one but, rather, a plurality of signal points.

Advantageously, the above-described decoding process is implementable in a highly parallel fashion, thereby reducing the time required for decoding which allows for the practical implementation of more complicated—and thus more effective—block-coded schemes and/or higher input data rates. In particular, the 2D point metrics can be calculated for each of the N 2D points of a received 2N-dimensional signal all at the same time, and similarly for the 4D and 8D subset metrics. Moreover, once a number of 2N-dimensional signal are available at the deinterleaver output, each of those signals may be decoded independently of the others in parallel fashion.

The foregoing merely illustrates the principles of the invention. For example, although the invention is described herein in the context of block coding, it is equally applicable to trellis codes. In particular, a base trellis code takes in a sequence of input data and, for each different such input data sequence, encodes it into an associated sequence of base signal points. In order to form the expanded code from the base trellis code, each point of the sequence of base signal points is mapping into a group of R modulated signal points taken from some predetermined constellation. The overall effect, then, is that the expanded code takes a sequence of input data and encodes it into a sequence of modulated signal points from the predetermined constellation. As with block codes, the mapped group of signal points do not have to be time-contiguous with one another. Thus, if the stream of signal points generated by the base trellis code are S1, S2, S3, S4, S5 ..., then the stream of signal points generated by the expanded code could be, for example, $S_1, S_1, S_2, S_2, S_3, S_3, S_4, S_4, S_5 \ldots$ or $S_1, S_2, S_3, S_4, S_1, S_2, S_3, S_4, S_5 \ldots$. Assuming that the base code has X-fold diversity, then, as in the case of the expanded block codes, the expanded version of the base trellis code will have (R×X)-fold diversity as long as each pair of the mapped groups of R signal points differ from each other at all R signal point positions.

It may also be noted that block codes can be described in like terms by reading the successive input data blocks (comprised of (m×N) bits in the illustrative embodiment) as comprising a sequence of input data resulting in a sequence of modulated signal points which is comprised of the concatenation of the successive 2N-dimensional codewords generated by the block code.

Additionally, although the invention is described herein principally in the context of wireless LANs, it is equally applicable to other transmission environments in which fading and/or interference are significant impairments.

Moreover, the various expanded codes described herein need not be used exclusively in a particular system. For example, in a system in which a particular, relatively low level of diversity, e.g., X=2, will usually be adequate to achieve system requirements, a code such as the 8D base code of FIGS. 9-10 could be used. However, if the transmission environment should deteriorate, the system can be programmed to switch its operation to use one of the expanded codes, such as the 16D code expanded from the base code of FIGS. 9-10 using the mapping shown in FIG. 12. As another example, two of the 16D expanded codes described herein can be used together in this way. For example, when conditions are normal, the system may use the 16D expanded code with diversity X=4 which is expanded from the base code of FIGS. 9-10 with the mapping of FIG. 12. When conditions deteriorate, the system may switch to another 16D expanded code with diversity X=6 which is expanded from the base code of FIG. 11 with, again, the mapping of FIG. 12. The second of the two above approaches may be deemed preferable inasmuch as the two codes have the same dimensionality, viz., 16, thereby simplifying system implementation.

The above approach of switching from a first code to a second code having greater diversity—and thereby achieving enhanced error protection—is not limited to cases in which it is anticipated that the transmission environment may deteriorate from time to time. For example, it can also be used when, at particular times, it is desired to obtain a higher degree of error protection, such as when particularly crucial data is being communicated.

In general, the above approach is based on a recognition by me that in implementing a fallback scheme or providing a higher degree of error protection, the use of a code with a larger amount of diversity may often be advantageous. This is in contrast to the prior art approach to this issue—say, in telephone line modems—which is to increase the distance between the transmitted sequences of signal points.

Other variations are possible. For example, various values of such parameters as N, M, R, m, r, X, and MDX can be chosen. It may be noted, however, that in many applications there will be a limit on the number of independently fading hopping frequencies that can be achieved and the value of N should be chosen with this in mind.

An additional alternative way of constructing a codeword repetition code is to concatenate each base codeword with another base codeword in a random fashion. This approach, however, will, in general, result in a code that is complex to decode.

In accordance with another variation, antenna diversity may be added to the system in order to provide even greater performance enhancement. In particular, the receiving station may be provided with two or more receiving antennas. A signal point received from a second antenna can be treated as if it were an additional signal point in the group of signal points mapped from a base signal point of the base code and can thus be processed as such. The resulting ensemble of preliminary 2D point metrics—being derived from the multiple antennas and/or actual signal points in the mapped group—can then all be combined to provide the final 2D point metrics.

In accordance with another variation, the modulation performed by modulator 21, although disclosed herein as being M-PSK, could alternatively be M-DPSK (i.e., M-ary differential phase shift keying). Indeed, the latter may be the preferred approach when, in a particular application, accurate carrier phase recovery is difficult.

Moreover, although particular circuit structures are shown or implied for various functional elements, such as interleaver 16 and interference-detection sequence inserter 19, these are by way of example only, and various alternative structures for achieving the desired functionalities will be apparent to those skilled in the art. In a particular such alternative structure, the erasure flag provided externally to the decoder as shown in FIG. 2 can be eliminated and the checker/remover, internally responsive to that flag, can reset the affected received signal points to zero.

In this same vein, it will be appreciated that although various discrete circuit elements are shown in the FIGS., the various functions thereof could be equivalently performed by one or more appropriately programmed special- or general-purpose processors.

It will thus be appreciated that various arrangements may be devised by those skilled in the art which, although not explicitly shown or described herein, embody the principles of the invention and are within its spirit and scope.

I claim:

1. Apparatus comprising
   means for receiving sequences of input data, and
   means for encoding said sequences of input data into sequences of groups of R modulated signal points taken from a predetermined constellation, R being an integer greater than unity, said sequences of modulated signal points comprising a predetermined expanded modulated code having built-in X-fold diversity, where X is an integer greater than unity,
   each of said groups being mapped from a respective base signal point of a respective sequence of modulated signal points of a predetermined modulated base code.

2. The invention of claim 1 wherein said modulated base code is a trellis code.

3. The invention of claim 1 wherein said modulated base code is a block code.

4. The invention of claim 1 further comprising means for transmitting a signal representing each said encoded sequence of modulated signal points.

5. The invention of claim 1 wherein said constellation of modulated signal points is an M-PSK constellation, where M is a selected integer.

6. The invention of claim 1 further comprising means for transmitting a signal representing each said encoded sequence of modulated signal points using carrier phase differences.

7. The invention of claim 1 wherein each of the sequences of said expanded code differs from each other sequence of said expanded code at at least X particular signal point positions.

8. The invention of claim 1 wherein each of the sequences of modulated signal points of said expanded code differs from each other sequence of said expanded code at at least X particular signal point positions and wherein said apparatus further comprises means for transmitting the signal points comprising said encoded sequences in respective signalling intervals.

9. Apparatus comprising
   means for receiving a succession of blocks of input data, and
   means for defining an expanded code comprised of codewords each associated with a unique one of the possible values of said input data blocks and for generating, in response to said blocks of input data, the associated ones of said codewords, each of the codewords of said expanded code being comprised of a finite sequence of groups of R modulated signal points taken from a predetermined constellation of modulated signal points, R being an integer greater than unity, said expanded code having built-in X-fold diversity, where X is an integer greater than unity, the codewords of said expanded code having been arrived at via a mapping of each of the signal points of a respective codeword of a predetermined base block code into the respective group of R signal points taken from said predetermined constellation, each codeword of said predetermined base code being comprised of at least two signal points.

10. The invention of claim 9 further comprising means for transmitting a signal representing said generated codewords.

11. The invention of claim 9 wherein said constellation of modulated signal points is an M-PSK constellation, where M is a selected integer.

12. The invention of claim 11 further comprising means for transmitting a signal representing said generated signal points using carrier phase differences.

13. The invention of claim 9 wherein said defining and generating means generates said ones of said generated codewords by encoding said each block of input data into blocks of encoded bits and by selecting the signal points which comprise each one of said generated codewords in response to said each block of encoded bits.

14. The invention of claim 9 wherein each of the codewords of said expanded code differs from each other codeword of said expanded code at at least X particular signal point positions.

15. The invention of claim 9 wherein each of the codewords of said expanded code differs from each other codeword of said expanded code at at least X particular signal point positions and wherein said apparatus further comprises means for transmitting the signal points comprising said generated codewords in respective signalling intervals.

16. A method comprising the steps of receiving sequences of input data, and encoding said sequences of input data into sequences of groups of R modulated signal points taken from a predetermined constellation, R being an integer greater than unity, said sequences of modulated signal points comprising a predetermined expanded modulated code having built-in X-fold diversity, where X is an integer greater than unity, each of said groups being mapped from a respective base signal point of a respective sequence of modulated signal points of a predetermined modulated base code.

17. The invention of claim 16 wherein said modulated base code is a trellis code.

18. The invention of claim 16 wherein said modulated base code is a block code.

19. The invention of claim 16 comprising the further step of transmitting a signal representing each said encoded sequence of modulated signal points.

20. The invention of claim 16 wherein said constellation of modulated signal points is an M-PSK constellation, where M is a selected integer.

21. The invention of claim 16 comprising the further step of transmitting a signal representing each said encoded sequence of modulated signal points using carrier phase differences.

22. The invention of claim 16 wherein each of the sequences of said expanded code differs from each other sequence of said expanded code at at least X particular signal point positions.

23. The invention of claim 16 wherein each of the sequences of modulated signal points of said expanded code differs from each other sequence of said expanded code at at least X particular signal point positions and wherein said method comprises the further step of transmitting the signal points comprising said encoded sequences in respective signalling intervals.

24. A method comprising the steps of receiving a succession of blocks of input data, and defining an expanded code comprised of codewords each associated with a unique one of the possible values of said input data blocks and generating, in response to said blocks of input data, the associated ones of said codewords, each of the codewords of said expanded code being comprised of a finite sequence of groups of R modulated signal points taken from a predetermined constellation of modulated signal points, R being an integer greater than unity, said expanded code having built-in X-fold diversity, where X is an integer greater than unity, the codewords of said expanded code having been arrived at via a mapping of each of the signal points of a respective codeword of a predetermined base block code into the respective group of R signal points taken from said predetermined constellation, each codeword of said predetermined base code being comprised of at least two signal points.

25. The invention of claim 24 comprising the further step of transmitting a signal representing said generated codewords.

26. The invention of claim 24 wherein said constellation of modulated signal points is an M-PSK constellation, where M is a selected integer.

27. The invention of claim 26 comprising the further step of transmitting a signal representing said generated signal points using carrier phase differences.

28. The invention of claim 24 wherein in said defining and generating step said ones of said generated codewords are generated by encoding said each block of input data into blocks of encoded bits and by selecting the signal points which comprise each one of said generated codewords in response to said each block of encoded bits.

29. The invention of claim 24 wherein each of the codewords of said expanded code differs from each other codeword of said expanded code at at least X particular signal point positions.

30. The invention of claim 24 wherein each of the codewords of said expanded code differs from each other codeword of said expanded code at at least X particular signal point positions and wherein said method comprises the further step of transmitting the signal points comprising said generated codewords in respective signalling intervals.

31. A method for decoding each of a plurality of sequences of received modulated signal points, each said sequence of received modulated signal points being a received, channel-impaired version of a sequence of transmitted modulated signal points representing a sequence of input data, the sequences of transmitted modulated signal points having been arrived at via a mapping of each point of a sequence of base signal points of a predetermined base code into a respective corresponding group of R signal points taken from a predetermined constellation, R being an integer greater than unity, said method comprising the steps of measuring, for each received signal point, the squared Euclidean distance between said received signal point and all signal points of said constellation to provide a plurality of preliminary signal point metrics, forming a plurality of final signal point metrics associated with a particular base signal point, each such final signal point metric corresponding to a particular possible value of said particular base signal point and being a function of the particular preliminary signal point metrics associated with those received signal points which correspond to said particular base signal point, recovering said input data from said final signal point metrics.

* * * * *